US011541563B2

(12) United States Patent
Kwon et al.

(10) Patent No.: US 11,541,563 B2
(45) Date of Patent: Jan. 3, 2023

(54) APPARATUS FOR REMOVING BUMP OF DISPLAY DEVICE AND METHOD OF MANUFACTURING DISPLAY DEVICE USING THE SAME

(71) Applicant: Samsung Display Co., LTD., Yongin-si (KR)

(72) Inventors: Seung Wook Kwon, Yongin-si (KR); Chan Ho Moon, Yongin-si (KR); Jeong Seok Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 197 days.

(21) Appl. No.: 16/881,329

(22) Filed: May 22, 2020

(65) Prior Publication Data

US 2021/0016461 A1 Jan. 21, 2021

(30) Foreign Application Priority Data

Jul. 15, 2019 (KR) ........................ 10-2019-0085327

(51) Int. Cl.
*B26D 1/04* (2006.01)
*H01L 51/56* (2006.01)
(Continued)

(52) U.S. Cl.
CPC ............... *B26D 1/045* (2013.01); *G02B 1/14* (2015.01); *G06F 1/1652* (2013.01); *G09F 9/301* (2013.01); *H01L 51/56* (2013.01)

(58) Field of Classification Search
CPC ... G06F 1/1652; H01L 51/56; H01L 51/0097; H01L 2227/323; H01L 51/5253;
(Continued)

(56) References Cited

U.S. PATENT DOCUMENTS 6,629,330 B2 * 10/2003 Schultheis ............. A47L 17/06 30/169
7,267,540 B2 9/2007 Fridley et al.
(Continued)

FOREIGN PATENT DOCUMENTS

KR 101445060 B1 9/2014
KR 1020190027409 A 3/2019

OTHER PUBLICATIONS

Gang et al., "Mechanical Cutting Process Trends for Difficult-to-Cut Materials—A Review—", Journal of the Korean Society for Precision Engineering, vol. 35, No. 3, 2018, pp. 253-267.

*Primary Examiner* — Muhammad N Edun
(74) *Attorney, Agent, or Firm* — Cantor Colburn LLP

(57) ABSTRACT

A method of manufacturing a display device includes providing a display panel including a folding area at which the display panel is foldable, and a flat area which is adjacent to the folding area; providing a protective film on both the flat area and the folding area of the display panel; removing a portion of the protective film which corresponds to the folding area, from the display panel, to expose the folding area outside a remaining portion of the protective film, where the remaining portion of the protective film defines a bump of the protective film at a portion of the flat area which is closest to the folding area; and removing a portion of the bump from the portion of the flat area.

23 Claims, 7 Drawing Sheets

210
200
23
22
21

(51) Int. Cl.
*G02B 1/14* (2015.01)
*G09F 9/30* (2006.01)
*G06F 1/16* (2006.01)

(58) Field of Classification Search
CPC ... H01L 27/3244; H01L 2251/56; G02B 1/14; G09F 9/301; B26D 1/045
See application file for complete search history.

(56) References Cited

U.S. PATENT DOCUMENTS

| | | | | |
|---|---|---|---|---|
| 9,812,659 | B2 | 11/2017 | Kwon et al. | |
| 2005/0223567 | A1* | 10/2005 | Cobb | B26B 5/005 30/337 |
| 2009/0241346 | A1* | 10/2009 | Bilenski | B26B 5/005 30/353 |
| 2018/0136371 | A1* | 5/2018 | Kim | B32B 27/06 |
| 2019/0074469 | A1 | 3/2019 | Kwon et al. | |

* cited by examiner

FIG. 6C_(1)
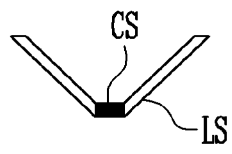
FIG. 6C_(2)
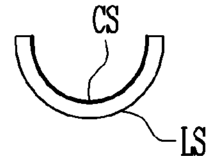
FIG. 6C_(3)
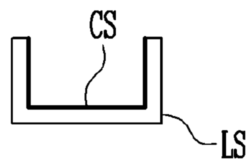
FIG. 6C_(4)
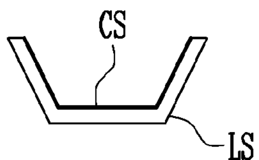
FIG. 7
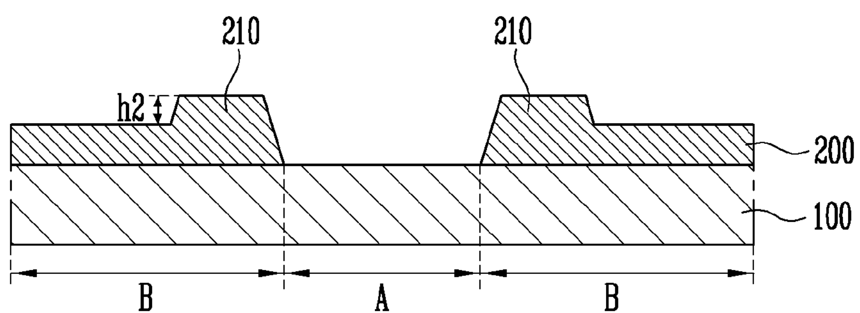

APPARATUS FOR REMOVING BUMP OF DISPLAY DEVICE AND METHOD OF MANUFACTURING DISPLAY DEVICE USING THE SAME

This application claims priority to Korean Patent Application No. 10-2019-0085327, filed on Jul. 15, 2019, and all the benefits accruing therefrom under 35 U.S.C. § 119, the content of which in its entirety is herein incorporated by reference.

BACKGROUND

1. Field

The disclosure relates to an apparatus for removing a bump from a display device, and a method of manufacturing a display device using the same.

2. Description of the Related Art

An optical display device such as a liquid crystal display device and an organic light emitting diode display device includes a flexible film as a replacement for a glass substrate or a relatively high hardness substrate. Accordingly, a display device having flexibility, to be foldable and unfoldable, has been developed.

SUMMARY

One or more embodiment provides a method of manufacturing a display device capable of easily removing a bump incidentally occurring when providing or forming a folding area of a display device, and an apparatus for removing the bump, which is used in the method.

A method of manufacturing a display device includes providing a display panel including a folding area at which the display panel is foldable, and a flat area which is adjacent to the folding area; providing a protective film on both the flat area and the folding area of the display panel; removing a portion of the protective film which corresponds to the folding area, from the display panel, to expose the folding area outside a remaining portion of the protective film, where the remaining portion of the protective film defines a bump of the protective film at a portion of the flat area which is closest to the folding area; and removing a portion of the bump from the portion of the flat area.

In an embodiment, exposing the folding area may include removing a portion of the protective film corresponding to the folding area by using a heat block as a heating element.

In an embodiment, in exposing the folding area, a ratio of a thickness of the protective film to a width of the exposed folding area may be about 1:5 to about 1:15.

In an embodiment, the cutter may include a blade which is applicable to the bump to separate the portion of the bump, and a handle connected to the blade and with which the blade is applicable to the bump.

In an embodiment, an angle formed between a cutting surface of the blade and a bottom surface of the blade, may be equal to or less than about 30°.

In an embodiment, a cutting surface of the blade may be oblique to a longitudinal direction of the blade.

In an embodiment, a cutting surface of the blade may define a side surface of the blade.

In an embodiment, the blade may have a cross section of a V-shape, a U-shape, a quadrangle, a trapezoid or a hemisphere shape.

In an embodiment, the cutter may further include a support portion which connects the handle and the blade to each other, and the support portion may support the handle so that a length of the handle is oblique to a direction perpendicular to a bottom surface of the blade.

In an embodiment, an angle formed between a longitudinal direction center axis of the handle and a longitudinal direction center axis of the support portion, may be equal to or greater than about 45° and may be equal to or less than about 135°.

In an embodiment, an angle formed between the bottom surface of the blade and a longitudinal direction center axis of the support portion, may be equal to or greater than about 45° and may be equal to or less than about 135°.

In an embodiment, an angle formed between a longitudinal direction center axis of the support portion and a longitudinal direction center axis of the handle, may be equal to or greater than an angle formed between the longitudinal direction center axis of the support portion and the bottom surface of the blade.

In an embodiment, the bump protrudes from a reference plane within the protective film, and the removing the portion of the bump using the cutter disposes the bottom surface of the blade at an angle relative to the reference plane of the protective film, where the angle may be equal to or less than about 45°.

In an embodiment, removing the bump may include defining a thickness of the protective film which is equal to or less than 100 micrometers (μm) based on the reference plane of the protective film.

A cutter for manufacturing a display device includes: a blade with which a portion of a bump of a protective film is removable from a flat area of a display panel of the display device, where the bump is disposed at a portion of the flat area of the display panel, which is closest to a folding area of the display panel, and the blade includes a cutting surface, and a bottom surface which is opposite to the cutting surface; and a handle which is connected to the blade and with which the blade is applicable to the bump by a force applicator.

In an embodiment, an angle formed between a cutting surface of the blade and a bottom surface of the blade, may be equal to or less than about 30°.

In an embodiment, a cutting surface of the blade may be oblique to a longitudinal direction of the blade.

In an embodiment, a cutting surface of the blade may define a side surface of the blade.

In an embodiment, the blade may have a cross section of a V-shape, a U-shape, a quadrangle, a trapezoid, or a hemisphere shape.

In an embodiment, the cutter may further include a support portion which is between the handle and the blade and connects the handle and the blade to each other, where the support portion supports the handle so that a length of the handle is oblique to a direction perpendicular to a bottom surface of the blade.

In an embodiment, an angle formed between a longitudinal direction center axis of the handle and a longitudinal direction center axis of the support portion, may be equal to or greater than about 45° and may be equal to or less than about 135°.

In an embodiment, an angle formed between the bottom surface of the blade and a longitudinal direction center axis of the support portion, may be equal to or greater than about 45° and may be equal to or less than about 135°.

In an embodiment, an angle formed between a longitudinal direction center axis of the support portion and a longitudinal direction center axis of the handle, may be equal to or greater than an angle formed between the longitudinal direction center axis of the support portion and the bottom surface of the blade.

According to one or more embodiment, a bump of a protective film that incidentally occurs when forming the folding area of a display panel, by removing a portion of the bump the protective film, may be easily removed using the cutter. Therefore, a folding disturbance phenomenon of the display device due to bump at a position closest to the folding area, may be effectively prevented, thereby improving quality of the display device.

BRIEF DESCRIPTION OF THE DRAWINGS

The above and other features of the disclosure will become more apparent by describing in further detail, embodiments thereof with reference to the accompanying drawings, in which:

FIG. 7 is a cross-sectional view illustrating an embodiment of a shape of the bump;

DETAILED DESCRIPTION

Figure 1A:
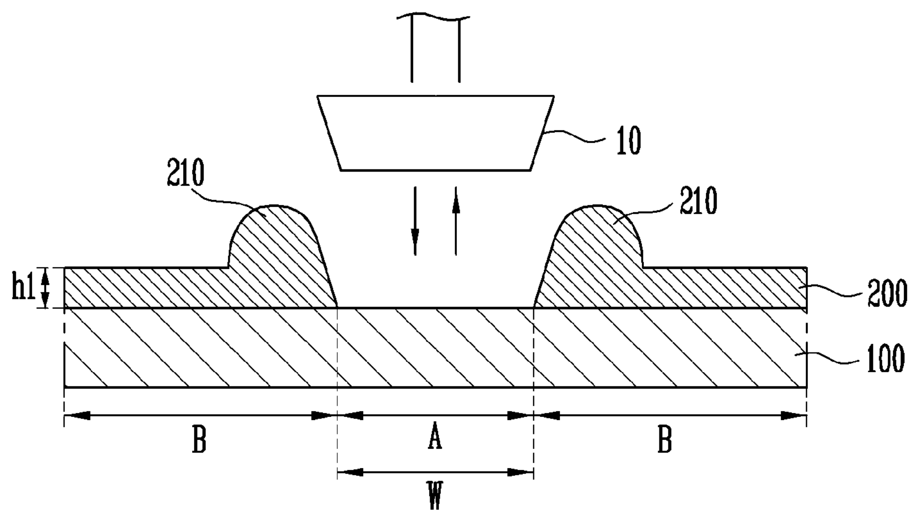
FIGS. 1A and 1B are cross-sectional views sequentially illustrating processes in an embodiment of a method of manufacturing a display device.

The disclosure may be modified in various manners and have various forms. Therefore, embodiments will be illustrated in the drawings and will be described in detail in the specification. However, it should be understood that the disclosure is not intended to be limited to the disclosed forms, and the disclosure includes all modifications, equivalents, and substitutions within the spirit and technical scope of the disclosure.

Similar reference numerals are used for similar components in describing each drawing. In the accompanying drawings, the dimensions of the structures are shown enlarged from the actual dimensions for the sake of clarity of the disclosure.

Terms of “first”, “second”, and the like may be used to describe various components, but the components should not be limited by the terms. The terms are used only for the purpose of distinguishing one component from another component. For example, without departing from the scope of the disclosure, a first component may be referred to as a second component, and similarly, a second component may also be referred to as a first component. The singular expressions include plural expressions unless the context clearly indicates otherwise.

The terminology used herein is for the purpose of describing particular embodiments only and is not intended to be limiting. As used herein, “a”, “an,” “the,” and “at least one” do not denote a limitation of quantity, and are intended to include both the singular and plural, unless the context clearly indicates otherwise. For example, “an element” has the same meaning as “at least one element,” unless the context clearly indicates otherwise. “At least one” is not to be construed as limiting “a” or “an.” “or” means “and/or.” As used herein, the term “and/or” includes any and all combinations of one or more of the associated listed items. It should be understood that in the present application, a term of “include,” “have” or the like is used to specify that there is a feature, a number, a step, an operation, a component, a part, or a combination thereof described in the specification, but does not exclude a possibility of the presence or addition of one or more other features, numbers, steps, operations, components, parts, or combinations thereof in advance.

In addition, a case where a portion of a layer, a film, an area, a plate, or the like is referred to as being related to another element such as being “on” another portion, it includes not only a case where the portion is “directly on” another portion, but also a case where there is further another portion between the portion and another portion. In contrast, where a portion of a layer, a film, an area, a plate, or the like is referred to as being related to another element such as being “directly on” another portion, there is no further portion or element (e.g., intervening member) between the portion and the other element.

In addition, in the present specification, when a portion of a layer, a film, an area, a plate, or the like is “on” another portion, a forming direction is not limited to an upper direction but includes the portion on a side surface and/or in a lower direction. On the contrary, when a portion of a layer, a film, an area, a plate, or the like is “under” another portion, this includes not only a case where the portion is “directly beneath” another portion but also a case where there is further another portion between the portion and another portion.

Furthermore, relative terms, such as “lower” or “bottom” and “upper” or “top,” may be used herein to describe one element’s relationship to another element as illustrated in the Figures. It will be understood that relative terms are intended to encompass different orientations of the device in addition to the orientation depicted in the Figures. For example, if the device in one of the figures is turned over, elements described as being on the “lower” side of other elements would then be oriented on “upper” sides of the other elements. The exemplary term “lower,” can therefore, encompasses both an orientation of “lower” and “upper,” depending on the particular orientation of the figure. Similarly, if the device in one of the figures is turned over, elements described as “below” or “beneath” other elements would then be oriented “above” the other elements. The exemplary terms “below” or “beneath” can, therefore, encompass both an orientation of above and below.

“About” or “approximately” as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A display device may be manufactured by providing a protective film 200 for protecting a display panel 100, during a manufacturing process. In a method of manufacturing the display device, a portion of the protective film 200 is heated and removed, to provide a folding area A at which the display panel 100 is foldable. That is, the folding area A is a planar area at which the protective film 200 is removable from the display panel 100. In heating and removing of the protective film 200, a protective film 200 melted at the folding area A may be pushed onto a surface of the protective film 200 and thus a bump 210 having a protruding shape is formed. The bump 210 is disposed at a boundary between the folding area A and the flat area B. If the bump 210 having the protruding shape, is left on the display panel 100, interference of a folding operation of the display panel 100 may occur.

Hereinafter, embodiments of the disclosure will be described in detail with reference to the accompanying drawings.

Figure 1B:
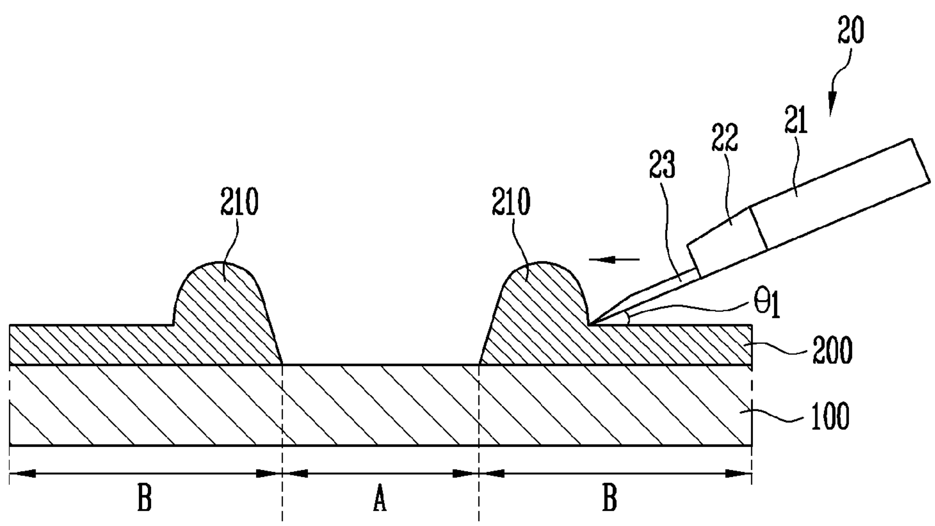
Figure 2A:
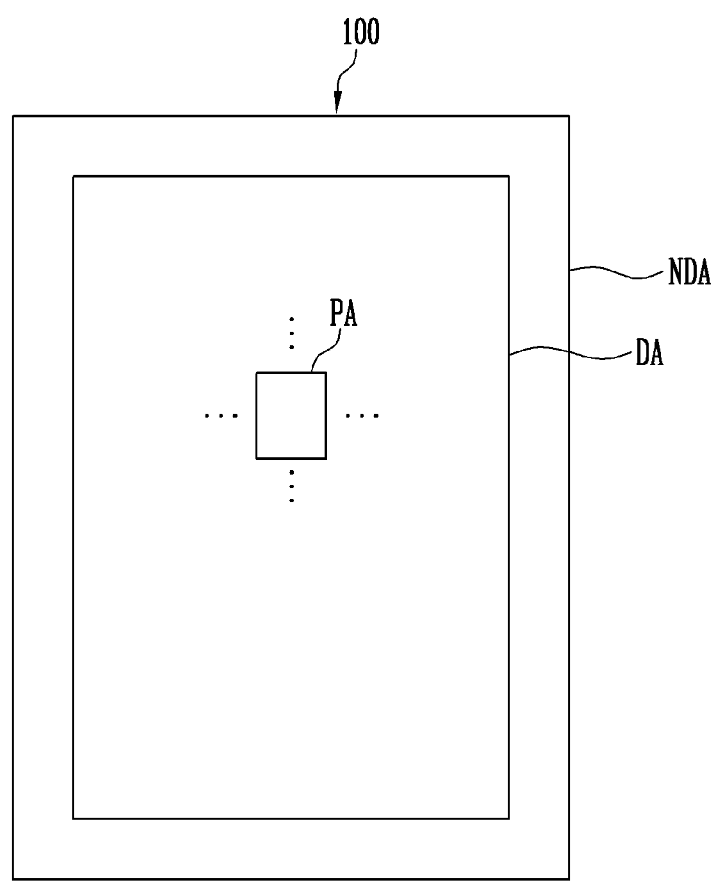
FIG. 2A is a top plan view of a display panel of a display device which is shown in FIG. 1A.
Figure 2B:
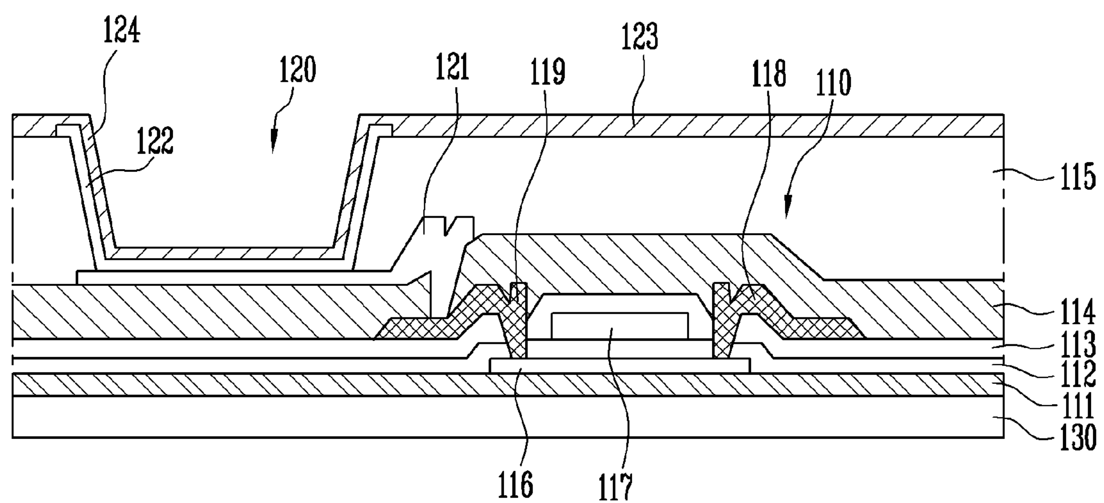
FIG. 2B is an enlarged cross-sectional view of an embodiment of the display panel.
Figure 3:
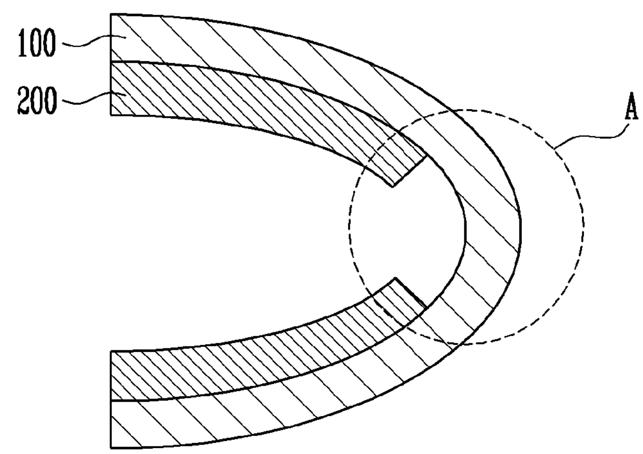
FIG. 3 is an enlarged cross-sectional view illustrating an embodiment of the display device manufactured by a manufacturing method, which is folded.

FIGS. 1A and 1B are cross-sectional views sequentially illustrating processes in an embodiment of a method of manufacturing a display device, FIG. 2A is a top plan view of a display panel 100 of a display device which is shown in FIG. 1A, FIG. 2B is an enlarged-cross-sectional view of an embodiment of the display panel 100 in FIG. 2A, and FIG. 3 is an enlarged cross-sectional view illustrating an embodiment of the display device manufactured by the manufacturing method, which is folded.

Referring to FIGS. 1A and 1B, the method of manufacturing the display device includes providing a protective film 200 on one surface of a display panel 100 of a display device, exposing a folding area A of the display panel 100, and removing a portion of a bump 210.

The display panel 100 may be provided with a thin film transistor 110 and a light emitting element 120 for implementing an image, on a flexible substrate 130 (e.g., base substrate). Since the display panel 100 uses the flexible substrate 130 instead of a relatively rigid glass substrate, the display panel 100 may be foldable and unfoldable within a range allowed by flexibility thereof. That is, the display panel 100 may implement a flexible display device that may be folded and unfolded.

The display panel 100 may include the folding area A, and a non-folding area (e.g., flat area B) which is adjacent to the folding area A. The flat area B may be provided in plurality including a first flat area and a second flat area. Two of the non-folding area (or the flat area B) may face each other with the folding area A therebetween, in a direction along the flexible substrate 130.

FIG. 2A schematically illustrates a planar structure of the display panel 100. The display device, the display panel 100 and various components of these elements, may be disposed in a plane defined by a first direction and a second direction which crosses the first direction. In FIG. 2A, for example, the horizontal direction and the vertical direction may variously represent the first direction and the second direction. A thickness of the display device, the display panel 100 and various components of these elements, may be defined along a third direction which crosses both the first direction and the second direction. In FIGS. 1A, 1B and 2B, for example, the vertical direction represents the thickness direction, while the horizontal direction variously represents the first direction and/or the second direction.

Referring to FIG. 2A, the display panel 100 may include a display area DA at which an image is displayed, and a non-display area NDA which is adjacent to the display area DA. The display area DA may include a pixel area PA provided in plurality (e.g., a plurality of pixel areas PA), and a pixel which is provided in plurality as a plurality of pixels (not shown) which generates and/or emits a light may be provided for each pixel area PA. The image may be provided using the light emitted from the plurality of pixels provided in the display area DA.

In an embodiment, the non-display area NDA may be disposed to surround the display area DA, without being limited thereto. The non-display area NDA may include a driver such as a scan driver (not shown) and/or a data driver (not shown) for transferring an electrical signal to the plurality of pixels provided in the display area DA.

In FIG. 2A, the non-display area NDA surrounds the display area DA. However, the disclosure is not limited thereto, and the non-display area NDA may be disposed on one side of the display area DA to reduce a planar area where an image is not displayed, that is, a dead area. The non-display area NDA may be a planar area at which an image is not displayed.

In one of the pixel area PA in the display area DA, a thin film transistor 110 and a light emitting element 120 such as an organic light emitting diode or element, may be provided as shown in FIG. 2B. A structure of the thin film transistor 110 will be described. A buffer layer 111 may be provided on the flexible substrate 130, and an active layer 116 of the thin film transistor 110 may be provided on the buffer layer 111.

The flexible substrate 130 may include or be formed of a flexible material such as polyimide, polyethylene naphthalate, polyethylene terephthalate, polyarylate, polycarbonate, polyether imide, or polyethersulfone, but a material of the flexible substrate 130 is not limited thereto.

The active layer 116 may have source and drain regions doped with an N-type or P-type impurity at a relatively high concentration. In addition, the active layer 116 may include or be formed of an oxide semiconductor. In an embodiment, for example, the oxide semiconductor may include an oxide of a material selected from Group 12, 13, 14 metal elements such as zinc (Zn), indium (In), gallium (Ga), tin (Sn) cadmium (Cd), germanium (Ge), or hafnium (Hf), and a combination thereof.

A gate electrode 117 of the thin film transistor 110 may be provided or formed on the active layer 116, by interposing a gate insulating layer 112 (e.g., first insulating layer) therebetween. A source electrode 118 and a drain electrode 119 of the thin film transistor 110, may be provided or formed on the gate electrode 117.

An interlayer insulating film 113 (e.g., second insulating layer) may be provided between the gate electrode 117, and each of the source electrode 118 and the drain electrode 119, respectively. A passivation film 114 may be interposed respectively between each of the source electrode 118 and the drain electrode 119, and an anode electrode 121 of the light emitting element 120.

An insulating planarization film 115 (e.g., third insulating layer) may be provided on the anode electrode 121. The insulating planarization film 115 may include acryl or the like. An opening 124 is provided or defined in the insulating planarization film 115 by portions thereof.

The light emitting element 120 may emit red, green, and blue light according to a flow of electrical current to display image information. The light emitting element 120 as an organic light emitting diode, for example, may include the anode electrode 121 (e.g., first electrode) connected to the drain electrode 119 of the thin film transistor 110 to receive a positive power, a cathode electrode 123 (e.g., second electrode) provided to cover or be commonly disposed relative to multiple pixels and supply a negative power, and a light emitting layer 122 disposed between the anode electrode 121 and the cathode electrode 123.

Although not explicitly shown, the light emitting element 120 may further include a hole injection layer ("HIL"), a hole transport layer ("HTL"), an electron transport layer ("ETL"), an electron injection layer ("EIL"), and the like may be provided adjacent to the light emitting layer 122.

The light emitting layer 122 may be provided separately for each pixel (e.g., a light emitting pattern) such that pixels emitting red, green and blue light collectively form one unit of the pixel. Alternatively, the light emitting layer 122 may be provided in common throughout an entirety of the display area DA and/or pixel areas, regardless of a position of the pixel within the display area DA.

In an embodiment, the light emitting layer 122 may be provided or formed by vertically stacking or combining layers including, for example, a light emitting material emitting red, green, and blue light. In an embodiment, as long as the light emitting layer 122 may emit white light, a combination of different colors is possible. In addition, a color conversion layer (not shown) or a color filter (not shown) for converting emitted white light into a different color may be further provided.

A thin film encapsulation layer (not shown) in which an organic film and an inorganic film are stacked may be provided or formed on the cathode electrode 123.

Since the display panel 100 may be flexibly deformed, the display panel 100 and various components thereof may be foldable or unfoldable to be used according to folding and unfolding operations of the display device.

The protective film 200 may be provided on a surface of the display panel 100 having the layers and components described above. Specifically, the protective film 200 may be provided on a surface (e.g., first surface) of the display panel 100 which is opposite to a surface (e.g., display surface or second surface) of the display panel 100 which provides the image. Referring again to FIGS. 1A and 1B, a display surface of the display panel 100, at which the image is provided, is the lower surface, while the protective film 200 is provided in the surface which is opposite to the display surface.

Referring to FIG. 3, the display panel 100 may be folded to define an end portion at which the folding area A is disposed. The display panel 100 which is folded, disposes the surface of the display panel 100 which is provided with the protective film 200, facing inwardly, such that portions of the protective film 200 face each other. The display panel 100 which is folded, disposes the display surface facing outside the display panel 100 (e.g., exposed to outside the display panel 100 at the end portion thereof).

In an embodiment of a method of manufacturing a display device, the protective film 200 may be attached to the display panel 100, such as by providing an adhesive or an adhesive film (not shown) on a surface of the display panel 100. Alternatively, the protective film 200 may be provided or formed by coating a protective film material or protective film-forming composition on the surface of the display panel 100 and curing the protective film-forming composition.

The protective film 200 may include a plastic material such as a plastic film including at least one of polyethylene terephthalate ("PET"), polyethylene ("PE"), polyvinyl chloride ("PVC"), polypropylene ("PP"), polystyrene ("PS"), polyacrylonitrile ("PAN"), styrene-acrylonitrile copolymer ("SAN"), acrylonitrile-butadiene-styrene ("ABS"), and polymethyl methacrylate ("PMMA").

A polyethylene terephthalate film may be suitable for use as the protective film 200 because the polyethylene terephthalate film has heat resistance, fatigue strength, an electrical characteristic and the like, and is less affected by temperature and humidity than other materials.

In the method of manufacturing the display device described above, the protective film 200 is provided on a surface of the display panel 100 of a display device. The protective film 200 is provided in both the folding area A and the flat area B. The protective film 200 may be a single layer of material which is provided on the surface of the display panel 100, where that single layer of material corresponds to both the folding area A and the flat area B.

Referring to FIG. 1A, the folding area A which is covered by the protective film 200 may be exposed outside of the protective film 200, such as by removing a portion of the protective film 200 corresponding to the folding area A. The removing of the portion of the protective film 200 may include using a heat block 10, which is a heating element, to expose the folding area A of the display panel 100 from a remaining portion of the protective film 200 corresponding to the flat area B. Exposing the folding area A include applying heat by a heat block 10, to a portion of the protective film 200 which corresponds to the folding area A, to remove the portion of the protective film 200 from the display panel 100. That is, the protective film 200 provided on the folding area A may be melted and removed using the heating element such as the heat block 10.

Referring to FIGS. 1A and 2, the display panel 100 may include the flat area B and the folding area A which is adjacent to the flat area B. The flat area B may refer to a planar area where the folding of the display panel 100 is not generated or the display panel 100 is not foldable (e.g., a non-folding area). Referring to FIG. 2, an area of the flat area B adjacent to the folding area A in a direction along the display panel 100, may be slightly curved as the display panel 100 is folded. That is, the display panel 100 which is folded may dispose a portion of the flat area B of the display panel 100 which is closest to the folding area A, curved relative to a remainder of the flat area B of the display panel 100 which is further from the folding area A.

The folding area A may be a planar area in which the display panel 100 may be folded (e.g., foldable). The display panel 100 may be smoothly folded at the folding area A by removing a portion of the protective film 200 corresponding to the folding area A. In addition, peeling off or separation of the protective film 200 from the display panel 100, due to repetition of the folding and unfolding operations of the display panel 100, may be suppressed by removing a portion of the protective film 200 corresponding to the folding area A.

The protective film 200 may be applied to the surface of the display panel 100, to have a thickness h1. In an embodiment, the single layer of material for forming the protective film 200 may be applied at the thickness h1 across an entirety of the planar area of the surface of the display panel 100, without being limited thereto. The thickness h1 may be a minimum thickness of the protective film 200, without being limited thereto. A portion of the protective film 200 which is closest to the folding area A, may have an increased thickness greater than the thickness h1, owing to the melting and removing of the portion of the protective film 200 such as by using the heating element described above.

Referring to FIG. 1A, a ratio of a thickness h1 of the protective film 200 provided on the surface of the display panel 100, to a width W of the folding area A which is exposed to outside the protective 200 such as by using the heating element like the heat block 10, may be about 1:5 to about 1:15. That is, the display panel 100 which is unfolded or flat defines the ratio of the thickness h1 of the protective film 200 to the width W of the folding area A which is exposed. In an embodiment, the ratio of the thickness h1 of the protective film 200 to the width W of the folding area A which is exposed, may be about 1:6.5 to about 1:13, about 1:8 to about 1:11, about 1:5 to about 1:9, or about 1:10 to about 1:15.

The display panel 100 which is bent or folded disposes the folding area A to have a radius of curvature at an end portion of the display panel 100. Where the radius of curvature of the folding area A is equal to or greater than about 0.25 millimeters (mm) and is equal to or less than about 0.35 mm, within the display device which is folded, the ratio of the thickness h1 of the protective film 200 to the width W of the folding area A which is exposed may be about 1:5 to about 1:10. Where the radius of curvature of the folding area A is equal to or greater than about 0.4 mm and is equal to or less than about 0.5 mm, within the display device which is folded, the ratio of the thickness h1 of the protective film 200 to the width W of the folding area A which is exposed may be about 1:11 to about 1:15.

When the ratio of the thickness h1 of the protective film 200 to the width W of the folding area A is exposed is within the above-described range, contact of portions of the protective film 200 may be reduced or effectively prevented, when the display device is folded. Referring to FIGS. 1A and 1B, for example, ends of the protective film 200 which are closest to the folding area A, face each other in a direction along the display panel 100. That is, when the ratio of the thickness h1 of the protective film 200 to the width W of the folding area A is exposed is within the above-described range, the display device (or the display panel 100) which is folded, disposes the ends of the protective film 200 which face each other, to be spaced apart from each other (e.g., non-contacting with each other).

When the protective film 200 positioned on the folding area A is melted and removed using the heat block 10, the material of the protective film 200 which is melted by the heat block 10 is pushed toward both of opposing sides of the folding area A, to be displaced from the folding area A. The melted material is collected at a portion of the flat area B which is closest to the folding area A, and thus a bump 210 adjacent to the folding area A is incidentally formed.

The protruded portion of the protective film 200 (e.g., the bump 210) defines a thickness of the protective film 200 which is greater than the thickness h1 discussed above. A vertical extension of an upper surface of the protective film 200 having the thickness h1, may define a reference surface or reference plane coplanar with the upper surface of the protective film 200. A portion of the protective film 200 above this reference surface or reference plane may define the bump 210.

Referring to FIGS. 1A and 1B, the bump 210 provided at each of opposing sides of the folding area A may define ends of the protective film 200 which face each other across the folding area A. The display device (or the display panel 100) which is folded, may dispose the ends of the protective film 200 (e.g., at the bump 210) which face each other, to contact each other. When the bumps 210 contact each other when the display panel 100 is folded, improper folding of the display panel 100 may occur. Thus, one or more embodiment may remove a portion of the bump 210 from a remainder of the protective film 200, such as by using a removing tool like a cutter 20.

Hereinafter, the cutter 20 used for removing the bump 210 and a method of removing the bump 210 by using the cutter 20 will be described.

Figure 4A:
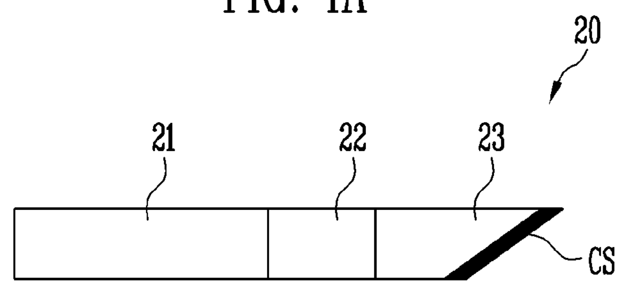
FIG. 4A is a top plan view of an embodiment of a cutter.
Figure 4B:
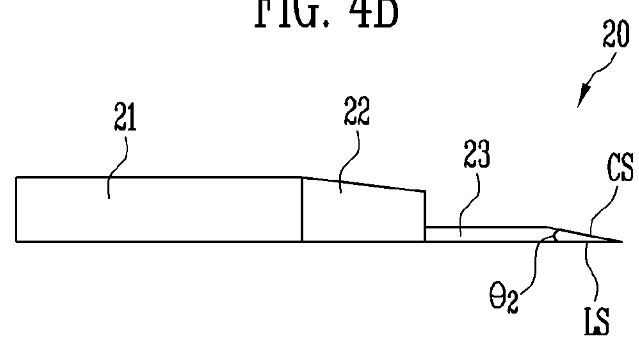
FIG. 4B is a cross-sectional side view of the cutter.
Figure 5:
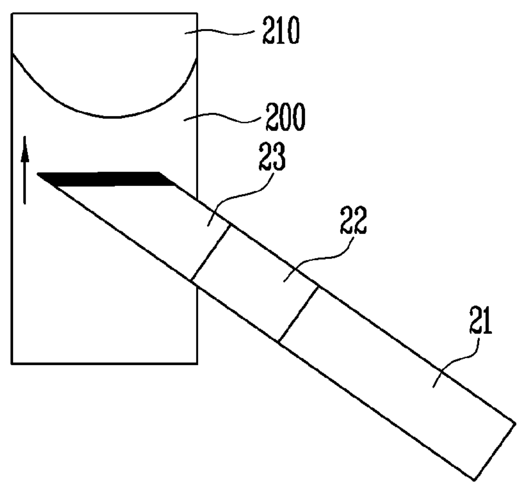
FIG. 5 is a top plan view of an embodiment of a process of removing a bump using the cutter.
Figure 6A:
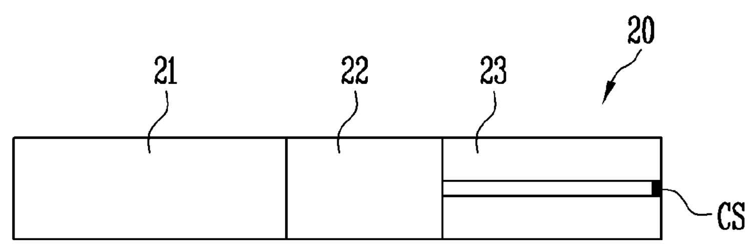
FIG. 6A is a top plan view of an embodiment of the cutter.
Figure 6B:
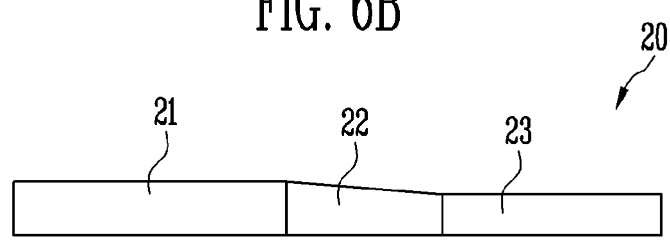
FIG. 6B is a cross-sectional side view of the cutter, and FIG. 6C_(1) through 6C_(4) are cross-sectional views of embodiments of a blade of a cutter.

FIG. 4A is a top plan view of an embodiment of the cutter 20, FIG. 4B is a cross-sectional side view of the cutter 20 in FIG. 4A, FIG. 5 is a top plan view of an embodiment of a process of removing the bump 210 using the cutter 20, FIG. 6A is a top plan view of an embodiment of a cutter 20, FIG. 6B is a cross-sectional side view of the cutter 20 in FIG. 6A, and FIG. 60_(1) through 60_(4) are cross-sectional views of embodiments of a blade 23 of a cutter 20.

The cutter 20 may be used to remove a portion of the bump 210 protruding from a remaining portion of the protective film 200. The cutter 20 may remove an increased thickness portion of the protective film 200 which defines the bump 210 at a position closest to the folding area A of the display panel 100 which is exposed by earlier removing of a portion of the protective film 200 corresponding to the folding area A of the display device. The remaining portion of the protective film 200 may be portions thereof corresponding to the flat area B adjacent to the folding area A within the display panel 100 of the display device.

The cutter 20 may be a hand tool used by a person or part of a machine, which each apply a force to the cutter 20 (e.g., force applicator). The cutter 20 may include a handle 21 at which the cutter 20 is connected to the force applicator and with which the cutter 20 is manipulated by the force applicator for removing of the bump 210, and a blade 23 which is connected to the handle 21 and with which the bump 210 is separated from a remainder of the protective film 200. In addition, the cutter 20 may further include a support portion 22 provided between the handle 21 and the blade 23, and with which the handle 21 is supported on the blade 23. The support portion 22 together with the handle 21 may together form a body of the cutter 20, from which the blade 23 is extended.

Referring to FIGS. 4A and 4B, the blade 23 may include a cutting surface CS or edge which contacts the bump 210 during removal of the portion thereof, and a bottom surface LS which is opposite to the cutting surface CS and is disposed adjacent to the protective film 200 when the bump 210 is removed. An angle $\Theta_2$ formed between the cutting surface CS of the blade 23 and the bottom surface LS of the blade 23 may be equal to or less than about 30°.

When the angle $\Theta_2$ formed between the cutting surface CS and the bottom surface LS of the blade 23 is within the above-described range, the bump 210 may be easily removed from a remainder of the protective film 200. Specifically, the cutting surface CS of the blade 23 is a surface which penetrates the protective film 200 such as at a lower portion of the bump 210 for cutting the bump 210 away from the remainder of the protective film 200. A fragment of the protective film 200 (e.g., the bump 210) which is cut by the blade 23 and separated from the protective film 200, is pushed to an upper side of the cutting surface CS (e.g., in a direction away from the remainder of the protective film 200. At this time, the fragment may be easily removed from the remainder of the protective film 200 by an upward force provided by the cutting surface CS inclined with respect to the bottom surface LS, by setting the angle $\Theta_2$ between the cutting surface CS and the bottom surface LS of the blade 23 to the above-described range. Since the angle $\Theta_2$ between the cutting surface CS and the bottom surface LS of the blade 23 applies an upward force when the cutter 20 is moved along the protective film 200, less additional force may be utilized in removing the bump 210.

The cutting surface CS of the blade 23 may be provided with a diagonal edge which is oblique to a longitudinal direction of the blade 23. Referring to FIG. 4A, the longitudinal direction of the blade 23 may mean a direction parallel to a direction in which the handle 21, the support portion 22 and the blade 23 are arranged connected (e.g., a length of the cutter 20). The blade 23 may include a longitudinal direction extended from the handle 21 to a distal end of the blade 23, which is furthest from the handle 21. Along the longitudinal direction, a first side of the blade 23 may be shorter than a second side of the blade 23, and the cutting surface CS may connect the first side to the second side to define the inclined edge of the blade 23 in the top plan view.

Since the cutting surface CS defines an oblique edge of the blade 23, relative to the longitudinal direction of the blade 23, the bump 210 may be more easily removed from a remainder of the protective film 200. Referring to FIG. 5, a progression direction or removing direction (indicated by the arrow) corresponds to a direction along which the bump 210 is adjacent to a remainder of the protective film 200. As the cutting surface CS defines a diagonal edge, a length of the cutter 20 may be positioned obliquely with respect to the progression direction while maintaining maximum contact of the diagonal edge with the bump 210, to more easily apply a force to the cutter 20 for removal of the bump 210.

In addition, the length of the cutter 20 positioned obliquely with respect to the progression direction disposes the handle 21 non-overlapping with the protective film 200. Since the handle 21 is not positioned over the protective film 200 during removal of the bump 210, interference of progression of the cutter 20 relative to the protective film 200, which is caused by contact of the force applicator at the handle 21 and the protective film 200, may be prevented.

The blade 23 may have a cross-section of a V-shape, a U-shape, a quadrangle, a trapezoid or a hemisphere shape. FIGS. 6A and 6B respectively illustrate a top view and a cross-sectional view of the cutter 20 including the blade 23 having the cross-section of the V-shape shown in FIG. 60_(1), respectively. FIG. 6C_(2) illustrates that the cross-section of the blade 23 is the U-shape, FIG. 60_(3) illustrates that the cross-section of the blade 23 is the quadrangle, and FIG. 60_(4) illustrates that the cross-section of the blade 23 is the trapezoid. The views of FIGS. 60_(1) through 60_(4) may be taken along a longitudinal direction (e.g., length) of the cutter 20 (e.g., right-to-left in FIGS. 6A and 6B). Damage of the surface of the protective film 200 may be minimized and the bump 210 may be removed, by forming the cross-section of the blade 23 in one of the shapes as described above.

In a process of removing the bump 210, the length of the cutter 20 positioned obliquely with respect to the progression direction not only disposes the handle 21 non-overlapping with the protective film 200 (FIG. 5), but also forms an angle between the bottom surface LS of the blade 23 and the surface of the protective film 200 which is equal to or less than about 45°. Referring to FIG. 1B, an angle Gi formed between the bottom surface LS of the blade 23 and the reference surface or reference plane of the protective film 200 may be equal to or greater than about 0° and equal to or less than about 45°, equal to or greater than about 0° and equal to or less than about 35°, equal to or greater than about 0° and equal to or less than about 20°, or equal to or greater than about 0° and equal to or less than about 10°.

By adjusting the angle $\Theta_1$ formed between the bottom surface LS of the blade 23 and the reference surface or reference plane of the protective film 200 to the above-described range, force applied from the force applicator to the bump 210 may be more concentrated on the bump 210, and the bump 210 may be easily removed. In addition, the reference surface or reference plane of the protective film 200 from which the bump 210 is removed may be provided or formed to be more flat after a process of removing the bump 210. Furthermore, damage to the reference surface or reference plane of the protective film 200 during removal of the bump 210 may be suppressed.

FIG. 7 is a cross-sectional view illustrating an embodiment of a shape of the bump 210.

Removing the bump 210 may include completely removing the bump 210 or removing a portion of the bump 210, relative to a surface of the protective film 200. Referring to FIG. 7 taken with FIG. 1A, a portion of the bump 210 may remain on the reference surface or reference plane of the protective film 200 since all of the bump 210 is not removed from a remainder of the protective film 200 using the cutter 20.

The portion of the bump 210 which remains may include a protrusion height h2 relative to the reference surface or reference plane. The protrusion height h2 in FIG. 7 is less than a height of the bump 210 in FIG. 1A. The protrusion height h2 of the bump 210 based on the reference plane of the protective film 200 may be equal to or less than about 100 micrometers (μm). By adjusting the protrusion height h2 of the bump 210 which remains as a portion of the protective film 200, based on the reference plane of the protective film 200, to be equal to or less than about 100 μm, restriction or disturbance of the folding operation of the display device by the bump 210 remaining protruding at the folding area A may be reduced or effectively prevented.

Figure 8A:
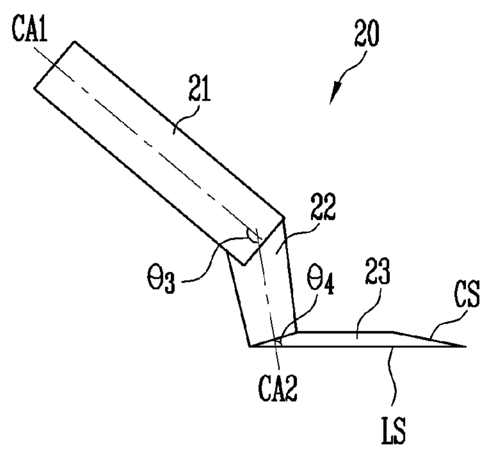
FIGS. 8A to 8C are cross-sectional side views of embodiments of the cutter.
Figure 8B:
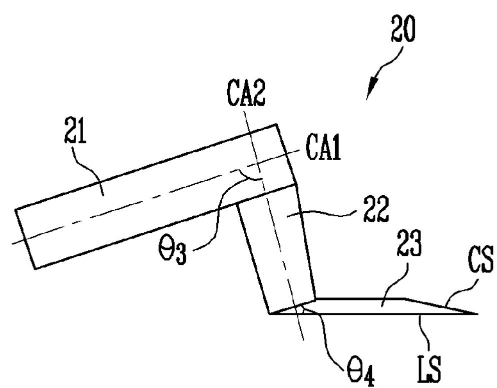
Figure 8C:
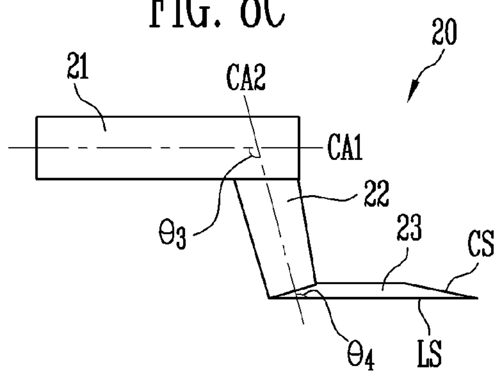
Figure 8D:
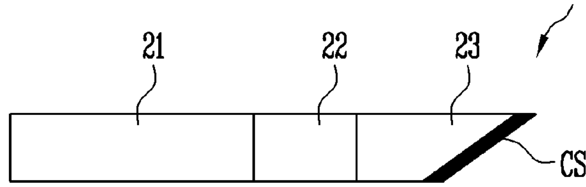
FIGS. 8D and 8E are top plan views of embodiments of the cutter.
Figure 8E:
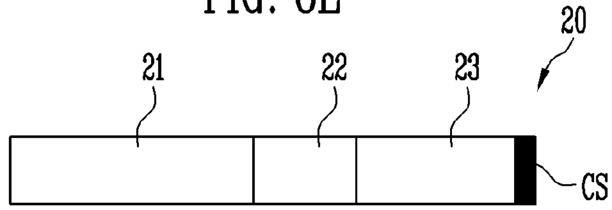
Figure 9:
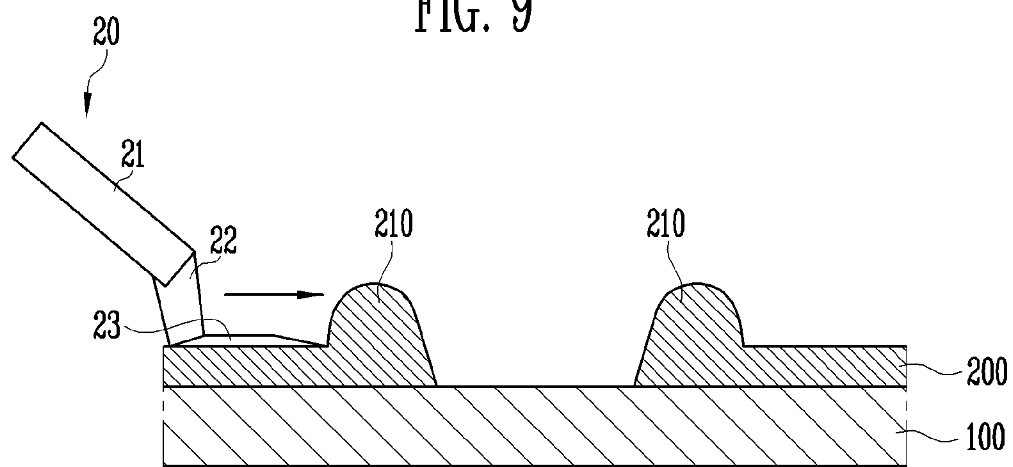
FIG. 9 is a diagram illustrating an embodiment of a process of removing the bump using the cutter.
Figure 10A:
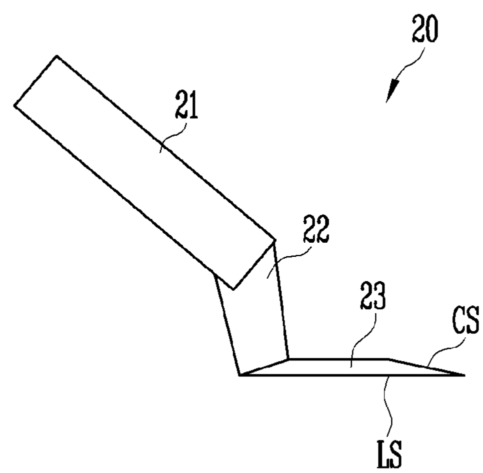
FIG. 10A is a cross-sectional side view of an embodiment of the cutter.
Figure 10B:
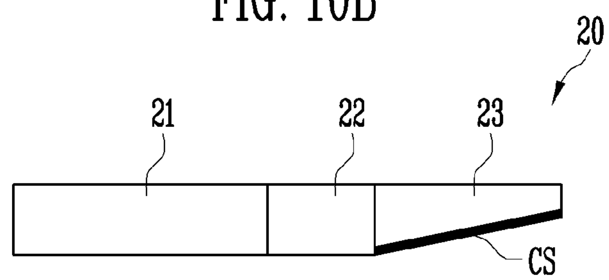
FIG. 10B is a top plan view of the cutter.

FIGS. 8A to 8C are cross-sectional side views of embodiments of the cutter 20, FIGS. 8D and 8E are top plan views of embodiments of the cutter 20, FIG. 9 is a diagram illustrating an embodiment of a process of removing the bump 210 using the cutter 20, FIG. 10A is a cross-sectional side view of an embodiment of the cutter 20, and FIG. 10B is a top plan view of the cutter 20.

A length of the handle 21 within the cutter 20, may be oblique to a direction perpendicular to the bottom surface LS of the blade 23 (e.g., perpendicular to a plane defined by the bottom surface LS). The support portion 22 of the cutter 20 may position the handle 21 obliquely relative to the direction perpendicular to the bottom surface LS of the blade 23. A length of the handle 21 may be defined along a longitudinal direction center axis CA1 (e.g., first longitudinal direction center axis), and a length of the support portion 22 may be defined along a longitudinal direction center axis CA2 (e.g., second longitudinal direction center axis). Referring to FIGS. 8A and 8B, an angle $\Theta_3$ formed between a longitudinal direction center axis CA1 of the handle 21 and a longitudinal direction center axis CA2 of the support portion 22 may be equal to or less than about 45° and equal to or less than about 135°.

The handle 21 may be connected to the support portion 22, at a first end of the handle 21. A second end of the handle 21 is opposite to the first end thereof. The longitudinal direction of the handle 21 may mean a direction parallel to a direction along which the first end and the second end thereof oppose each other, and the longitudinal direction center axis CA1 of the handle 21 may mean an axis that passes through a center of the handle 21 and is parallel to the longitudinal direction of the handle 21.

In addition, the support portion 22 may be connected to the handle 21, at a first end of the support portion 22. A second end of the support portion 22 is opposite to the first end thereof. The support portion 22 may be connected to the blade 23 at the second end of the support portion 22. The longitudinal direction of the support portion 22 may mean a direction parallel to a direction along which the first end and the second end thereof oppose each other. The longitudinal direction center axis CA2 of the support portion 22 may mean an axis that passes through a center of the support portion 22 and is parallel to the longitudinal direction of the support portion 22.

The force applicator may stably grip the cutter 20 when the bump 210 is removed, and the force applied by the force applicator to the cutter 20 may be easily transferred to the blade 23, by adjusting the angle $\Theta_3$ between by the longitudinal direction center axis CA1 of the handle 21 and the longitudinal direction center axis CA2 of the support portion 22 to the above-described range.

FIG. 8A illustrates an angle $\Theta_3$ formed between the longitudinal direction center axis CA1 of the handle 21 and the longitudinal direction center axis CA2 of the support portion 22 is an obtuse angle, and FIG. 8B illustrates an angle $\Theta_3$ formed between the longitudinal direction center axis CA1 of the handle 21 and the longitudinal direction center axis CA2 of the support portion 22 is an acute angle.

Referring to FIGS. 8A and 8B, an angle $\Theta_4$ formed between the bottom surface LS of the blade 23 and the longitudinal direction center axis CA2 of the support portion 22 may be equal to or greater than about 45° and equal to or less than about 135°. The support portion 22 may stably support the handle 21 and the blade 23 in relative positions to each other, even where the handle 21 is spaced apart along a direction perpendicular to the bottom surface LS of the blade 23 (e.g., vertical in FIGS. 8A through 8C), by adjusting the angle $\Theta_4$ formed between the bottom surface LS of the blade 23 and the longitudinal direction center axis CA2 of the support portion 22 to the above-described range.

The size of the angle $\Theta_3$ formed between the longitudinal direction center axis CA2 of the support portion 22 and the longitudinal direction center axis CA1 of the handle 21 may be equal to or greater than the size of angle $\Theta_4$ formed between the longitudinal direction center axis CA2 of the support portion 22 and the bottom surface LS of the blade 23.

When the size of the angle $\Theta_3$ is equal to or greater than the size of the angle $\Theta_4$, the force application gripping or coupled to the handle 21 may stably apply the force to the blade 23 through the support portion 22, and thus the force applicator may easily remove the bump 210 from a remaining portion of the protective film 200.

FIG. 8C illustrates the size of the angle $\Theta_3$ formed between the longitudinal direction center axis CA2 of the support portion 22 and the longitudinal direction center axis CA1 of the handle 21 is the same as the size of the angle $\Theta_4$ formed between the longitudinal direction center axis CA2 of the support portion 22 and the bottom surface LS of the blade 23.

FIGS. 8D and 8E illustrate top views of the cutter 20, according to the structures in FIGS. 8A to 8C. FIG. 8D illustrates the top view of the cutter 20 in which a length of the cutting surface CS extended along a width of the cutter 20 is formed oblique to the longitudinal direction of the blade 23, and FIG. 8E illustrates the top view of the cutter 20 in which a length of the cutting surface CS extended along the width of the cutter 20 is formed perpendicular to the longitudinal direction of the blade 23.

As the support portion 22 supports the handle 21 relative to the blade 23, such that a length of the handle 21 is provided oblique to the bottom surface LS of the blade 23, the force applicator may easily remove the bump 210 using the cutter 20. Referring to FIG. 9, since the bump 210 may be removed by moving the cutter 20 disposing the bottom surface LS of the blade 23 parallel to the surface of the protective film 200, along the progression direction (shown by arrow in FIG. 9), the surface or reference plane of the protective film 200 from which the bump 210 is removed may be maintained flat. That is, a position of the bottom surface LS of the blade 23 along a thickness direction of the protective film 200, corresponds to the surface or reference plane of the protective film 200 from which the bump 210 is removable.

Furthermore, since the handle 21 is spaced apart along a thickness direction of the protective film 200 from the surface or reference plane of the protective film 200 when the bump 210 is removed, interference of progression of the cutter 20 relative to the protective film 200 which is caused by contact of the force applicator gripping the cutter 20 at the handle 21 thereof, and the protective film 200, may be reduced or effectively prevented.

The cutting surface CS of the blade 23 may be provided on the side surface of the blade 23. Specifically, the cutting surface CS of the blade 23 may be extended along the side surface of the blade 23 in parallel to the progression direction of the blade 23. As shown in FIG. 10B, the cutting surface CS may form a diagonal line oblique to the longitudinal direction of the blade 23, and may be provided along an entirety of the side surface of the blade 23. An entirety of the side surface of the blade 23 may be defined from the support portion 22 to a distal end of the blade 23 (e.g., horizontal direction in FIG. 10B). The blade 23 may include a side surface which extends from the handle 21 to a distal end of the blade 21, which is furthest from the handle, and the cutting surface CS may define the side surface of the blade 23.

A length of the cutter 20 shown in FIGS. 10A and 10B may be positioned obliquely to the progression direction of the cutter 20, as shown in FIG. 5. Since the bottom surface LS of the blade 23 may guide the cutter 20 along a direction parallel to the surface or reference plane of the protective film 200 as shown in FIG. 9, the surface or the reference plane of the protective film 200 from which the bump 210 is removed may be maintained flat, and interference of the cutter 20 with the protective film 200 may be reduced or effectively prevented.

The foregoing detailed description illustrates and describes the disclosure. In addition, the foregoing description merely shows and describes embodiments of the disclosure, and as described above, the disclosure may be used in various other combinations, modifications, and environments, and the disclosure may be changed or modified within the scope of the concept of the disclosure disclosed in this specification, the scope equivalent to the disclosed disclosure, and/or the skill or knowledge in the art. Accordingly, the detailed description of the disclosure is not intended to limit the disclosure to the disclosed embodiments. Also, the appended claims should be construed as including other embodiments.

What is claimed is:

1. A method of manufacturing a display device, the method comprising:

providing a display panel comprising a folding area at which the display panel is foldable, and a flat area which is adjacent to the folding area;

providing a protective film on both the flat area and the folding area of the display panel;

removing a portion of the protective film which corresponds to the folding area, from the display panel, to expose the folding area outside a remaining portion of the protective film, wherein the remaining portion of the protective film defines a bump of the protective film at a portion of the flat area which is closest to the folding area; and removing a portion of the bump from the portion of the flat area by a cutter including a blade which is applicable to the bump to separate the portion of the bump, wherein a longitudinal direction of the blade is oblique to a progression direction in which the cutter moves when the blade is applied to the bump.

2. The method according to claim 1, wherein exposing the folding area comprises applying heat by a heat block, to the portion of the protective film which corresponds to the folding area, to remove the portion of the protective film from the display panel.

3. The method according to claim 1, wherein providing the protective film on the flat area of the display panel defines a thickness of the protective film, exposing the folding area defines a width of the folding area, and a ratio of the thickness of the protective film to the width of the folding area is about 1:5 to about 1:15.

4. The method according to claim 1, wherein the removing the portion of the bump comprises using the cutter to separate the portion of the bump from the remaining portion of the protective film, and the cutter includes a handle connected to the blade and with which the blade is applicable to the bump.

5. The method according to claim 4, wherein the blade of the cutter includes a cutting surface and a bottom surface which is opposite to the cutting surface, within the cutter, an angle between the cutting surface of the blade and the bottom surface of the blade, is equal to or less than about 30°, and the blade which is applied to the bump, contacts the cutting surface to the bump.

6. The method according to claim 4, wherein within the cutter, the blade includes a cutting surface spaced apart from the handle, wherein the longitudinal direction extends from the handle to a distal end of the blade, which is furthest from the handle, and wherein the cutting surface of the blade is oblique to the longitudinal direction of the blade.

7. The method according to claim 4, wherein within the cutter, the blade includes:

a side surface which extends from the handle to a distal end of the blade, which is furthest from the handle, and a cutting surface which defines the side surface of the blade.

8. The method according to claim 4, wherein within the cutter:

the longitudinal direction extends from the handle to a distal end of the blade, which is furthest from the handle, and in a view along the longitudinal direction, the blade has a V-shape, a U-shape, a quadrangle, a trapezoid or a hemisphere shape.

9. The method according to claim 4, wherein the cutter further includes a support portion which is between the handle and the blade and connects the handle and the blade to each other, and within the cutter:

the blade includes a cutting surface and a bottom surface which is opposite to the cutting surface, and the support portion which connects the handle and the blade to each other, disposes a length of the handle oblique to a direction perpendicular to the bottom surface of the blade.

10. The method according to claim 9, wherein within the cutter, the handle includes a longitudinal direction center axis extended along the length of the handle, the support portion includes a longitudinal direction center axis extended along a length of the support portion, and an angle formed between the longitudinal direction center axis of the handle and the longitudinal direction center axis of the support portion, is equal to or greater than about 45° and is equal to or less than about 135°.

11. The method according to claim 9, wherein within the cutter, the support portion includes a longitudinal direction center axis extended along a length of the support portion, and an angle formed between the bottom surface of the blade and the longitudinal direction center axis of the support portion, is equal to or greater than about 45° and is equal to or less than about 135°.

12. The method according to claim 9, wherein within the cutter:

the handle includes a longitudinal direction center axis extended along the length of the handle, the support portion includes a longitudinal direction center axis extended along a length of the support portion, and an angle formed between the longitudinal direction center axis of the support portion and the longitudinal direction center axis of the handle, is equal to or greater than an angle formed between the longitudinal direction center axis of the support portion and the bottom surface of the blade.

13. The method according to claim 4, wherein
the bump protrudes from a reference plane within the protective film,
the blade includes a cutting surface and a bottom surface which is opposite to the cutting surface, and
the removing the portion of the bump using the cutter, disposes the bottom surface of the blade at an angle relative to the reference plane of the protective film,
wherein the angle is equal to or less than about 45°.

14. The method according to claim 1, wherein
the bump protrudes from a reference plane within the protective film, and
the removing the portion of the bump defines a thickness of the protective film at the portion of the flat area which is closest to the folding area, the thickness of the protective film being equal to or less than about 100 micrometers relative to the reference plane of the protective film.

15. A cutter for manufacturing a display device, the cutter comprising:
a blade with which a portion of a bump of a protective film is removable from a flat area of a display panel of the display device,
wherein
the bump is disposed at a portion of the flat area of the display panel, which is closest to a folding area of the display panel, and
the blade comprises a cutting surface, and a bottom surface which is opposite to the cutting surface; and
a handle which is connected along a longitudinal direction of the blade and with which the blade is applicable to the bump by a force applicator,
wherein the longitudinal direction of the blade is oblique to a progression direction in which the cutter moves when the blade is applied to the bump.

16. The cutter according to claim 15, wherein an angle formed between the cutting surface of the blade and the bottom surface of the blade, is equal to or less than about 30°.

17. The cutter according to claim 15, wherein
the longitudinal direction extends from the handle to a distal end of the blade, which is furthest from the handle, and
the blade further comprises the cutting surface of the blade extended oblique to the longitudinal direction of the blade.

18. The cutter according to claim 15, wherein the blade further comprises:
a side surface which extends from the handle to a distal end of the blade, which is furthest from the handle, and the cutting surface of the blade defining the side surface of the blade.

19. The cutter according to claim 15,
wherein the longitudinal direction extends from the handle to a distal end of the blade, which is furthest from the handle, and
wherein in a view along the longitudinal direction, the blade has a V-shape, a U-shape, a quadrangle, a trapezoid or a hemisphere shape.

20. The cutter according to claim 15, further comprising:
a support portion which is between the handle and the blade and connects the handle and the blade to each other,
wherein the support portion which connects the handle and the blade to each other, disposes a length of the handle oblique to a direction perpendicular to the bottom surface of the blade.

21. The cutter according to claim 20, wherein
the handle includes a longitudinal direction center axis extended along the length of the handle,
the support portion includes a longitudinal direction center axis extended along a length of the support portion, and
an angle formed between the longitudinal direction center axis of the handle and the longitudinal direction center axis of the support portion, is equal to or greater than about 45° and is equal to or less than about 135°.

22. The cutter according to claim 20, wherein
the support portion includes a longitudinal direction center axis extended along a length of the support portion, and
an angle formed between the bottom surface of the blade and the longitudinal direction center axis of the support portion, is equal to or greater than about 45° and is equal to or less than about 135°.

23. The cutter according to claim 20, wherein
the handle includes a longitudinal direction center axis extended along the length of the handle,
the support portion includes a longitudinal direction center axis extended along a length of the support portion, and
an angle formed between the longitudinal direction center axis of the support portion and the longitudinal direction center axis of the handle, is equal to or greater than an angle formed between the longitudinal direction center axis of the support portion and the bottom surface of the blade.

* * * * *